United States Patent
Dosho et al.

(10) Patent No.: US 7,777,580 B2
(45) Date of Patent: Aug. 17, 2010

(54) COUPLED RING OSCILLATOR AND METHOD FOR LAYING OUT THE SAME

(75) Inventors: Shiro Dosho, Osaka (JP); Shiro Sakiyama, Kyoto (JP); Noriaki Takeda, Hyogo (JP)

(73) Assignee: Panasonic Corporation, Osaka (JP)

( * ) Notice: Subject to any disclaimer, the term of this patent is extended or adjusted under 35 U.S.C. 154(b) by 42 days.

(21) Appl. No.: 11/884,270

(22) PCT Filed: May 25, 2006

(86) PCT No.: PCT/JP2006/310955

§ 371 (c)(1),
(2), (4) Date: Aug. 14, 2007

(87) PCT Pub. No.: WO2006/126733

PCT Pub. Date: Nov. 30, 2006

(65) Prior Publication Data

US 2008/0068101 A1 Mar. 20, 2008

(30) Foreign Application Priority Data

May 27, 2005 (JP) ............................. 2005-155371
Sep. 15, 2005 (JP) ............................. 2005-268019

(51) Int. Cl.
*H03K 3/03* (2006.01)
(52) U.S. Cl. ......................................... 331/57; 331/56
(58) Field of Classification Search ................... 331/45, 331/56, 57
See application file for complete search history.

(56) References Cited

U.S. PATENT DOCUMENTS

| | | | |
|---|---|---|---|
| 5,357,217 A | 10/1994 | Marchesi et al. |
| 5,475,344 A | 12/1995 | Maneatis et al. |
| 5,592,126 A | 1/1997 | Boudewijns et al. |
| 5,592,127 A | 1/1997 | Mizuno |
| 5,717,362 A | 2/1998 | Maneatis et al. |
| 6,025,756 A | 2/2000 | Miyabe |
| 2004/0012453 A1 | 1/2004 | Dally et al. |

(Continued)

FOREIGN PATENT DOCUMENTS

JP 06-188634 7/1994

(Continued)

OTHER PUBLICATIONS

Japanese Notice of Reasons for Rejection, w/ English translation thereof, issued in Japanese Patent Application No. JP 2007-534931 dated Mar. 9, 2010.

*Primary Examiner*—Robert Pascal
*Assistant Examiner*—James E Goodley
(74) *Attorney, Agent, or Firm*—McDermott Will & Emery LLP

(57) ABSTRACT

A coupled ring oscillator includes n ring oscillators (20) each including m inverter circuits (10), and a phase-coupling loop (40) in which m×n phase-coupling circuits (30), each of which couples signal phases at two points in a certain phase mode, are connected with each other to form a loop. Connection points at which the inverter circuits (10) are connected with each other and the connection points at which the phase-coupling circuits (30) are connected with each other are connected bijectively; and each of the inverter circuits (10) is connected between two points that divide the phase-coupling circuits (30) into two parts at a certain ratio.

20 Claims, 11 Drawing Sheets

U.S. PATENT DOCUMENTS

| | | |
|---|---|---|
| 2004/0263265 A1 | 12/2004 | Allen et al. |
| 2005/0128011 A1 | 6/2005 | Wakii |
| 2006/0049879 A1 | 3/2006 | Chiang |

FOREIGN PATENT DOCUMENTS

| | | |
|---|---|---|
| JP | 07-507435 | 8/1995 |
| JP | 08-070239 | 3/1996 |
| JP | 2000-156629 | 6/2000 |
| JP | 2001-332698 | 11/2001 |
| JP | 2003-188689 | 7/2003 |
| JP | 2005-006025 | 1/2005 |
| WO | WO 94/26026 | 11/1994 |

COUPLED RING OSCILLATOR AND METHOD FOR LAYING OUT THE SAME

RELATED APPLICATIONS

This application is the U.S. National Phase under 35 U.S.C. §371 of International Application No. PCT/JP2006/310955, filed on May 25, 2006, which in turn claims the benefit of Japanese Application No. 2005-155371, filed on May 27, 2005 and Japanese Application No. 2005-268019, filed on Sep. 15, 2005, the disclosures of which Applications are incorporated by reference herein.

TECHNICAL FIELD

The present invention relates to ring oscillators and a method for laying out the ring oscillators, and more particularly relates to a coupled ring oscillator which uses a plurality of ring oscillators and is capable of generating highly accurate phase information and a method for laying out the coupled ring oscillator.

BACKGROUND ART

In order to record information on optical disc media such as a DVD (digital versatile disc), it is necessary to generate a special write-operation waveform for suppressing interference of a write signal. Generation of such a special write-operation waveform requires highly accurate phase information that is finer than one-fortieth of the write data rate. However, it is difficult to realize such extremely fine phase accuracy by a single inverter chain (a ring oscillator), because the phase delay thereof is shorter than a delay of a single inverter circuit. Therefore, conventionally, a plurality of ring oscillators are used and the respective inverter circuits in the ring oscillators are connected by phase-coupling circuits so as to slightly change the output phase of each ring oscillator, whereby phase information finer than that that can be generated by a single ring oscillator is produced (see, for example, Patent Documents 1, 2, and 3).

Also, a resistor ring, in which a plurality of resistors are connected, is provided, and the connection points of the resistors in the resistor ring are connected with the connection points of phase delay elements in a plurality of ring oscillators are connected to thereby produce fine phase information (see Patent Document 4, for example)

Patent Document 1: Specification of Patent No. 550030
Patent Document 2: Specification of U.S. Pat. No. 5,475,344
Patent Document 3: Specification of U.S. Pat. No. 5,717,362
Patent Document 4: Specification of US patent application publication No. 2006/0049879

DISCLOSURE OF THE INVENTION

However, in the conventional layout in which the respective inverter circuits in the ring oscillators are connected by the phase-coupling circuits, the wire length of some of the signal wires is extremely increased and only some of the inverter circuits are thus under heavy load. Such layout errors cause variations in the driving timing of the inverter circuits, making it difficult to generate highly accurate phase information.

In view of the above problem, it is therefore an object of the present invention to provide a coupled ring oscillator including a plurality of ring oscillators and capable of generating highly accurate phase information. Another object of the present invention is to provide a simple method for laying out the coupled ring oscillator.

In order to solve the above problem, an inventive coupled ring oscillator includes: n ring oscillators each including m inverter circuits; and a phase-coupling loop in which m×n phase-coupling circuits, each of which couples signal phases at two points in a certain phase mode, are connected with each other to form a loop, wherein connection points at which the inverter circuits are connected with each other and the connection points at which the phase-coupling circuits are connected with each other are connected bijectively; and each of the inverter circuits is connected between two points that divide the phase-coupling circuits into two parts at a certain ratio.

Then, the connection points at which the m inverter circuits in each of the n ring oscillators are connected with each other and the connection points at which the m×n phase-coupling circuits are connected with each other are connected bijectively, and each of the inverter circuits is connected between two points that divide the m×n phase-coupling circuits in the phase-coupling loop into two parts at a certain ratio. Therefore, all of the inverter circuits have substantially the same wire length, allowing highly accurate and fine phase information to be generated.

Specifically, the phase-coupling circuits each couple signal phases at two points in a reverse phase mode; and each of the inverter circuits is connected between two points that divide the phase-coupling circuits into n phase-coupling circuits and n×(m−1) phase-coupling circuits.

Also, specifically, the phase-coupling circuits each couple signal phases at two points in a common mode; and each of the inverter circuits is connected between two points that divide the phase-coupling circuits into n×(m−1)/2 phase-coupling circuits and n×(m+1)/2 phase-coupling circuits.

An inventive method for laying out a coupled ring oscillator includes the steps of: (a) connecting m×n basic cells each including a phase-coupling element and a circuit element, wherein the phase-coupling element corresponds to two connected half-circuits, each equivalent to half of a phase-coupling circuit for coupling two signal phases at two points in a reverse phase mode, at both ends of the phase-coupling circuit, the circuit element includes an inverter circuit in which either an input terminal or an output terminal is connected to a connection point at which the two half-circuits are connected with each other, and the m×n basic cells are connected into a loop so that each phase-coupling circuit is formed between adjacent ones of the phase-coupling elements; and (b) connecting, in any two of the basic cells existing (n−1) apart, the input terminal of the inverter circuit in one of the two basic cells with the output terminal of the inverter circuit in the other basic cell.

Then, the m×n basic cells each including the phase-coupling element and the inverter circuit are appropriately laid out to form a loop, whereby the above-mentioned coupled ring oscillator is obtained that includes the n ring oscillators, in each of which the m inverter circuits are connected with each other, and the phase-coupling loop, in which the m×n phase-coupling circuits are connected into a loop.

Another inventive method for laying out a coupled ring oscillator includes the steps of: (a) connecting m×n basic cells each including a phase-coupling circuit for coupling two signal phases at two points in a certain phase mode and a circuit element, wherein the circuit element includes an inverter circuit in which either an input terminal or an output terminal is connected to one end of the phase-coupling circuit, and the m×n basic cells are connected into a loop so that the phase-coupling circuits are connected with each other; and (b) connecting, in any two of the basic cells existing (n−1) apart, the input terminal of the inverter circuit in one of the two basic cells with the output terminal of the inverter circuit in the other basic cell.

Specifically, each of the phase-coupling circuits couples signal phases at two points in a reverse phase mode; and in the step (a), the basic cells are connected so that adjacent ones of the phase-coupling circuits are connected with each other.

Also, specifically, each of the phase-coupling circuits couples signal phases at two points in a common mode; and in the step (a), the basic cells are connected so that alternate ones of the phase-coupling circuits are connected with each other.

Then, the m×n basic cells each including the phase-coupling circuit and the inverter circuit are appropriately laid out to form a loop, whereby the above-mentioned coupled ring oscillator is obtained that includes the n ring oscillators, in each of which the m inverter circuits are connected with each other, and the phase-coupling loop, in which the m×n phase-coupling circuits are connected into a loop.

As described above, the inventive coupled ring oscillator generates highly accurate and fine phase information. Also, the inventive coupled ring oscillator is easily formed by connecting the basic cells into a loop.

BEST MODE FOR CARRYING OUT THE INVENTION

Hereinafter, preferred embodiments of the present invention will be described with reference to the accompanying drawings.

First Embodiment

Figure 1:
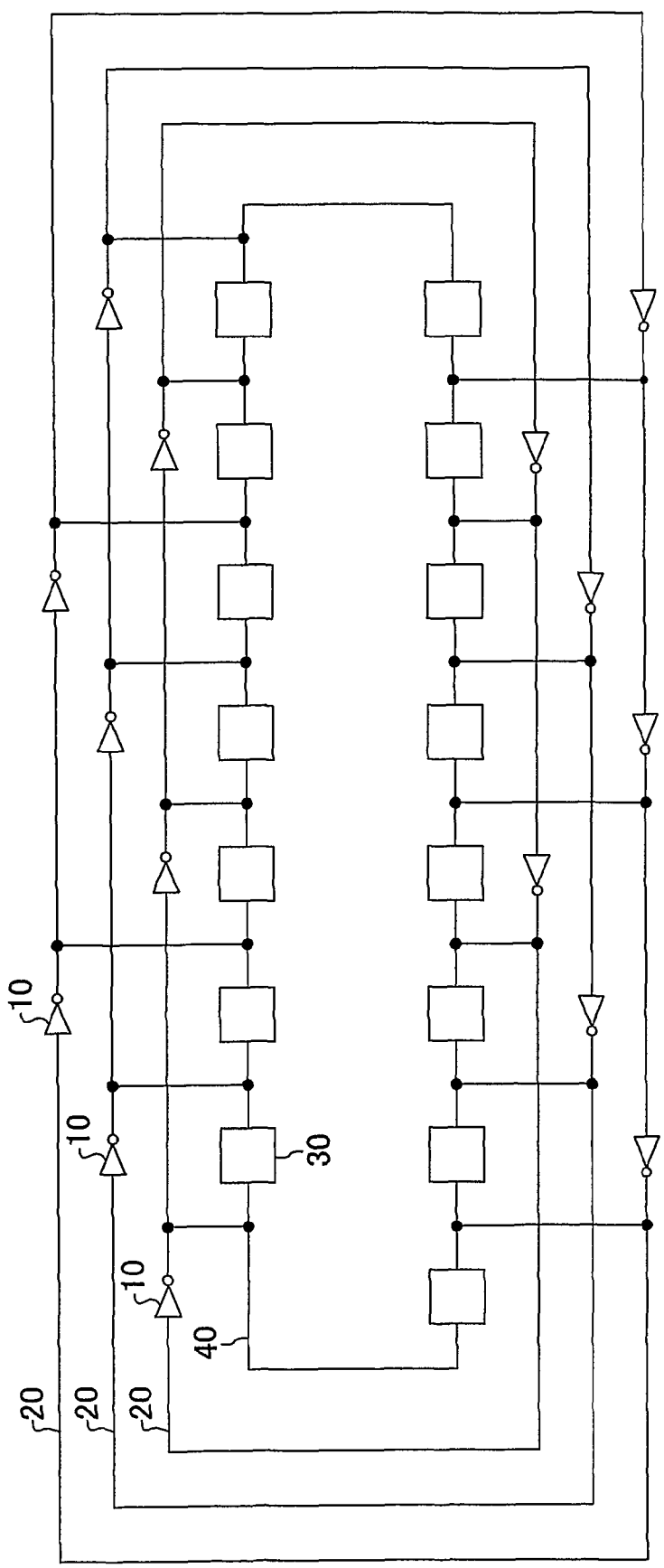
FIG. 1 shows the configuration of a coupled ring oscillator according to a first embodiment.

FIG. 1 shows the configuration of a coupled ring oscillator according to a first embodiment. The coupled ring oscillator shown in FIG. 1 includes three (n=3) ring oscillators 20, each composed of five (m=5) inverter circuits 10, and a phase-coupling loop 40 in which fifteen (m×n=15) phase-coupling circuits 30 are connected to form a loop.

The three ring oscillators 20 and the phase-coupling loop 40 are laid out in a nested pattern, in which the phase-coupling loop 40 is innermost. The connection points at which the phase-coupling circuits 30 are connected with each other and the connection points at which the inverter circuits 10 are connected with each other are connected. That is, the connection points of the phase-coupling circuits 30 and the connection points of the inverter circuits 10 are connected bijectively. Furthermore, each inverter circuit 10 is parallel-connected with three connected phase-coupling circuits 30. In other words, each inverter circuit 10 is connected between two points that divide the fifteen (m×n=15) phase-coupling circuits 30 into three (n=3) and twelve (n×(m−1)=12).

Figure 2A:
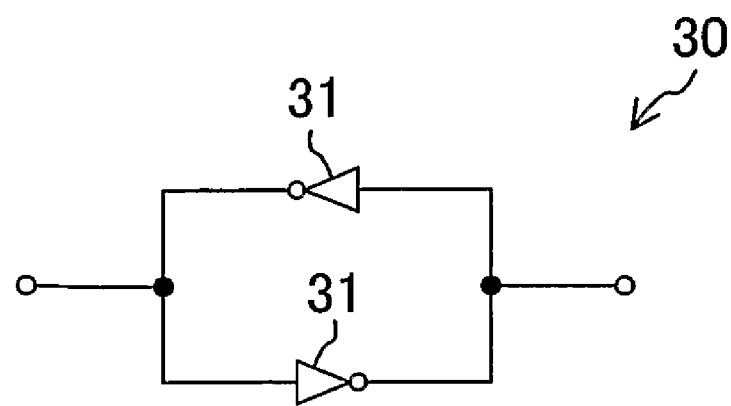
FIGS. 2A and 2B show circuit configurations of phase-coupling circuits shown in FIG. 1.
Figure 2B:
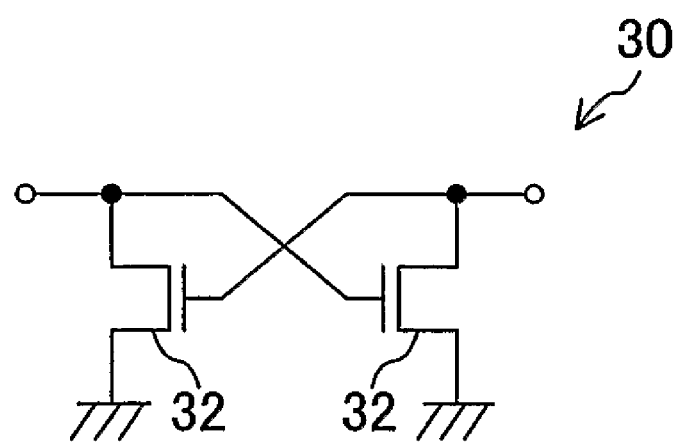

FIGS. 2A and 2B show exemplary circuit configurations of the phase-coupling circuits 30 shown in FIG. 1. Each phase-coupling circuit 30 of this embodiment couples signal phases at two points in a reverse phase mode. When the phase-coupling circuit 30 is composed of inverter circuits, the phase-coupling circuit 30 takes the form of a latch circuit in which the input terminal of one of the two inverter circuits 31 is connected to the output terminal of the other, as shown in FIG. 2A. When the phase-coupling circuit 30 is composed of MOS transistors, for example, NMOS transistors, the phase-coupling circuit 30 takes the form of a latch circuit in which the gate of one of the two NMOS transistors 32 is connected to the drain of the other, as shown in FIG. 2B.

The circuit layout of the coupled ring oscillator shown in FIG. 1 is completely different from the conventional one, and all of the inverter circuits 10 have substantially the same wire length. In the coupled ring oscillator of this embodiment, the phenomenon in which only some of the inverter circuits are under heavy load does not occur, which enables highly accurate and fine phase information to be generated. Also, each phase information can be taken out from each connection point of the phase-coupling circuits 30 in the phase-coupling loop 40, such that the phase information can be taken very easily.

Second Embodiment

Figure 3:
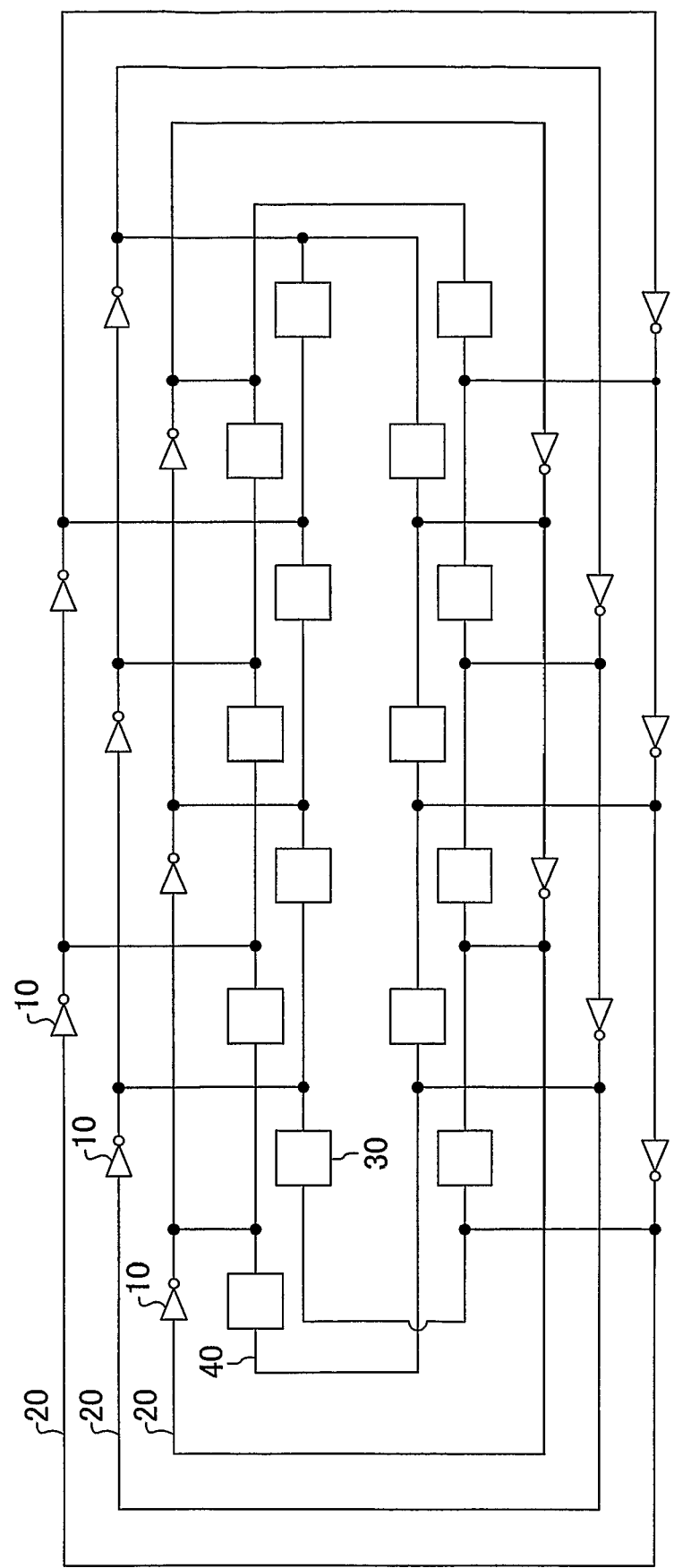
FIG. 3 shows the configuration of a coupled ring oscillator according to a second embodiment.

FIG. 3 shows the configuration of a coupled ring oscillator according to a second embodiment. As in the first embodiment, the coupled ring oscillator shown in FIG. 3 includes n(n=3) ring oscillators 20, each composed of five (m=5) inverter circuits 10, and a phase-coupling loop 40 in which fifteen (m×n=15) phase-coupling circuits 30 are connected to form a loop.

As in the first embodiment, the three ring oscillators 20 and the phase-coupling loop 40 are laid out in a nested pattern in which the phase-coupling loop 40 is innermost. The connection points of the phase-coupling circuits 30 and the connection points of the inverter circuits 10 are connected bijectively.

Unlike in the first embodiment, the phase-coupling circuits 30 of this embodiment each couple signal phases at two points in a common mode. That is, the phase-coupling circuits 30 are connected in such a manner that each phase-coupling circuit 30 connects two of the connection points of the inverter circuits 10 in two ring oscillators 20 that should be in phase with each other. Therefore, the phase-coupling loop 40 forms two turns and is closed, while connecting the ring oscillators 20 in an alternate manner. In other words, each inverter circuit 10 is connected between two points that divide the fifteen phase-coupling circuits 30 into six (n×(m−1)/2=6) and nine (n×(m+1)/2=9).

The phase-coupling circuits 30 of this embodiment each couple signal phases at two points in a common mode, and thus can be realized by resistive elements. Exemplary configurations of the phase-coupling circuits 30 will be described below.

Figure 4A:
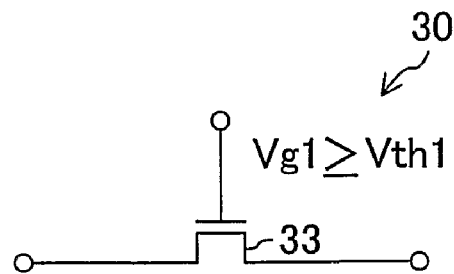
FIGS. 4A, 4B, 4C, and 4D show circuit configurations of phase-coupling circuits shown in FIG. 3.

FIG. 4A shows an example in which the phase-coupling circuit 30 is composed of an NMOS transistor 33, in which a voltage Vg1 that is higher than a threshold voltage Vth1 is applied between the gate and the source or between the gate and the drain. Preferably, a control voltage of the oscillation frequency of the ring oscillators 20 is applied to the gate of the NMOS transistor 33. Then, when the control voltage rises, for example, gm (transconductance) of the NMOS transistor 33 increases with the oscillation frequency and the amplitude of the ring oscillators 20, whereby the strength of the common mode coupling is increased. Therefore, the linearity of signal phase interpolation by the phase-coupling circuit 30 is maintained in a wide band.

Figure 4B:
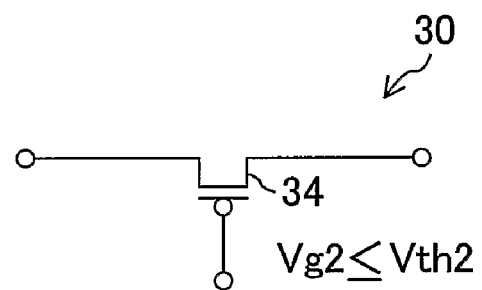

FIG. 4B shows an example in which the phase-coupling circuit 30 is composed of a PMOS transistor 34, in which a voltage Vg2 that is lower than a threshold voltage Vth2 is applied between the gate and the source or between the gate and the drain. Preferably, the gate of the PMOS transistor 34 is grounded. Then, when the control voltage of the oscillation frequency of the ring oscillators 20 rises, for example, gm (transconductance) of the PMOS transistor 34 increases with the oscillation frequency and the amplitude of the ring oscillators 20, whereby the strength of the common mode coupling is increased. Therefore, the linearity of signal phase interpolation by the phase-coupling circuit 30 is maintained in a wide band.

Figure 4C:
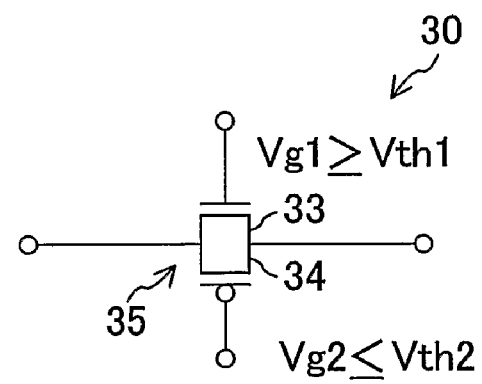

FIG. 4C shows an example in which the phase-coupling circuit 30 is composed of a transfer gate 35 in which the NMOS transistor 33 and the PMOS transistor 34 are combined. The combination of the NMOS and PMOS transistors increases the effect of linearity further.

Figure 4D:
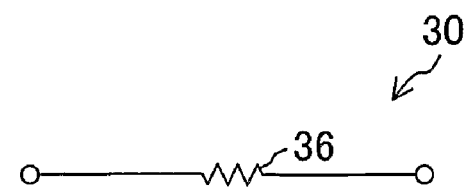

FIG. 4D shows an example in which the phase-coupling circuit 30 is composed of a resistance element 36. Although the resistance element 36 has the highest linearity, the resistance value does not change with the oscillation frequency of the ring oscillators 20. Therefore, the resistive element 36 is not so effective in signal phase interpolation.

As described above, in this embodiment, since the phases of the ring oscillators 20 are coupled by the resistive elements having high linearity, signal phase interpolation is performed more accurately.

It should be noted that the phase-coupling loop 40 is not limited to the configuration in which the phase-coupling loop 40 forms two turns and is closed. However, if the phase-coupling loop 40 is formed according to the below-described layout method, the phase-coupling loop 40 has the configuration shown in FIG. 3.

In the coupled ring oscillator according to the present invention, the number of ring oscillators 20 is not limited to three and the number of inverter circuits 10 forming each ring oscillators 20 is not limited to five.

(Layout Method)

Next, a method for laying out the coupled ring oscillators helpful for understanding the present invention will be described. The coupled ring oscillators according to the preferred embodiments have a geometrical regularity as shown in FIGS. 1 and 3 and thus can be easily formed by laying out a plurality of "basic cells".

FIGS. 5A-5D and 6A-6D show exemplary circuit configurations of basic cells in the coupled ring oscillator of the first embodiment. In FIGS. 5A-5D, the basic cells are formed using inverter circuits, while in FIGS. 6A-6D, the basic cells are formed using NMOS transistors. The basic cells shown in FIGS. 5A and 5B and FIGS. 6A and 6B are each composed of an inverter circuit 10, which is part of a ring oscillator 20, and a phase-coupling element 30'. The phase-coupling element 30' is equivalent to a configuration in which two half-circuits, each corresponding to half of a phase-coupling circuit 30 having a symmetrical circuit configuration, are connected at both ends of the phase-coupling circuit 30. For example, the phase-coupling elements 30' shown in FIGS. 5A and 5B have a circuit configuration in which the input terminals of two inverter circuits 31 are connected with each other. This corresponds to a configuration in which two inverter circuits 31 as half-circuits of the phase-coupling circuit 30 shown in FIG. 2A are connected at both ends of the phase-coupling circuit 30. Also, the phase-coupling elements 30' shown in FIGS. 6A and 6B have a circuit configuration in which the gates of two NMOS transistors 32 are connected with each other. This corresponds to a configuration in which two NMOS transistors 32 as half-circuits of the phase-coupling circuit 30 shown in FIG. 2B are connected at both ends of the phase-coupling circuit 30.

Figure 5A:
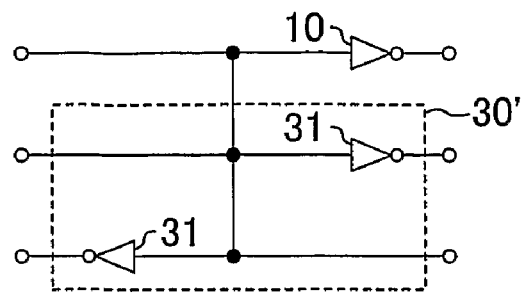
FIGS. 5A, 5B, 5C, and 5D show circuit configurations of basic cells in the coupled ring oscillator according to the first embodiment, in which inverter circuits are included.
Figure 5B:
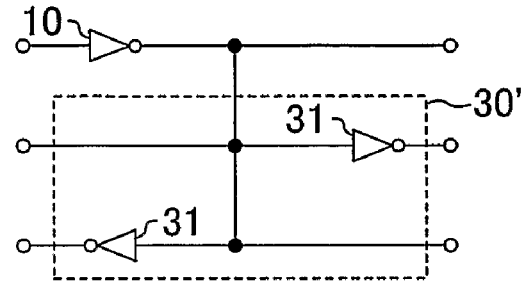
Figure 6A:
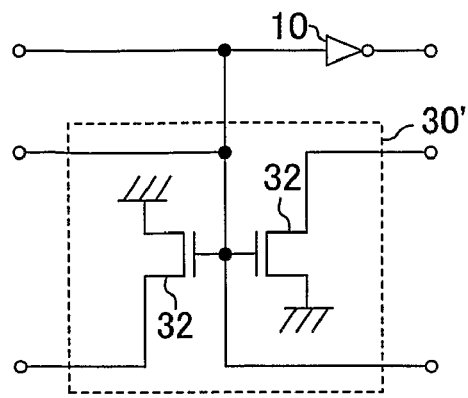
FIGS. 6A, 6B, 6C, and 6D show circuit configurations of basic cells in the coupled ring oscillator according to the first embodiment, in which NMOS transistors are used.
Figure 6B:
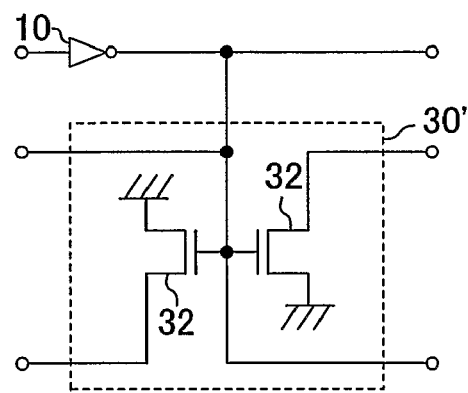
Figure 7:
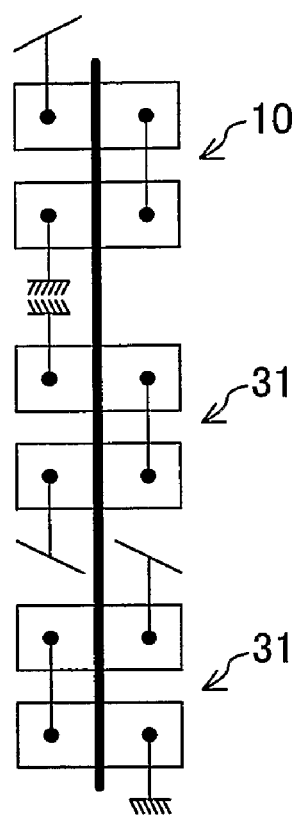
FIG. 7 shows an exemplary layout of the basic cell shown in FIG. 5.

The basic cells shown in FIGS. 5A and 6A have a configuration in which the input terminal of the inverter circuit 10 is connected with the phase-coupling element 30'. On the other hand, the basic cells shown in FIGS. 5B and 6B have a configuration in which the output terminal of the inverter circuit 10 is connected with the phase-coupling element 30'. In this way, either the input terminal or the output terminal of the inverter circuit 10 may be connected with the phase-coupling element 30'. However, it is preferable that the input terminal be connected with the phase-coupling element 30'. FIG. 7 shows an exemplary layout of the basic cell shown in FIG. 5A. By connecting the input terminal of the inverter circuit 10 with the phase-coupling element 30', the gates of the transistors forming the inverter circuit 10 are connected by a common wire with the transistors forming the inverter circuits 31. The configuration of the basic cell is thus simplified significantly. This effect is also obtained in the basic cell shown in FIG. 6A.

Figure 5C:
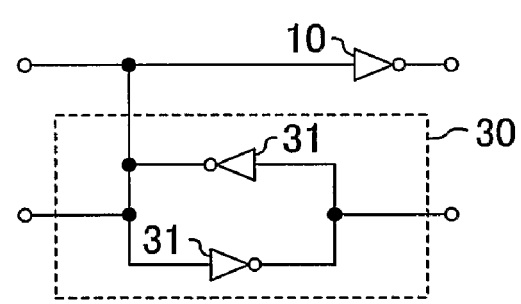
Figure 5D:
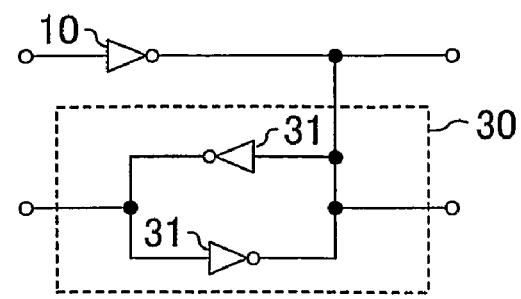
Figure 6C:
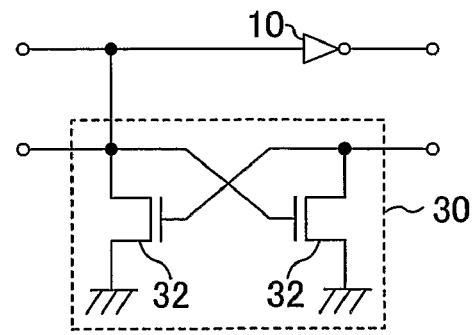
Figure 6D:
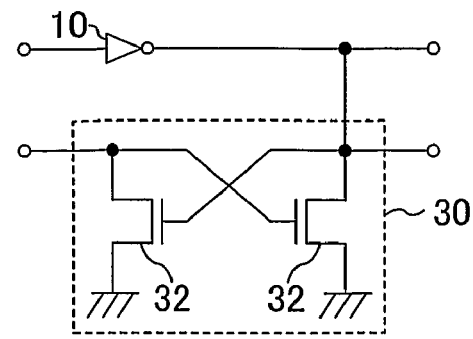

On the other hand, FIG. 5C shows an exemplary configuration of a basic cell in which the input terminal of an inverter circuit 10 as part of a ring oscillator 20 is connected with the phase-coupling circuit 30 shown in FIG. 2A. FIG. 5D shows an exemplary configuration of a basic cell in which the output terminal of an inverter circuit 10 as part of a ring oscillator 20 is connected with the phase-coupling circuit 30 shown in FIG. 2A. FIG. 6C shows an exemplary configuration of a basic cell in which the input terminal of an inverter circuit 10 as part of a ring oscillator 20 is connected with the phase-coupling circuit 30 shown in FIG. 2B. FIG. 6D shows an exemplary configuration of a basic cell in which the output terminal of an inverter circuit 10 as part of a ring oscillator 20 is connected with the phase-coupling circuit 30 shown in FIG. 2B. In this manner, the basic cell may be composed of a single inverter circuit 10 and a single phase-coupling circuit 30.

The coupled ring oscillator of the first embodiment is formed in the following manner. First, m×n basic cells are laid out appropriately so as to form a loop. The phase-coupling elements 30' or the phase-coupling circuits 30 in adjacent basic cells are connected with each other to form a single phase-coupling loop 40. The input terminal of the inverter circuit 10 in one of any two basic cells existing (n−1) apart is connected with the output terminal of the inverter circuit 10 in the other basic cell, thereby forming m ring oscillators 20. If the layout is performed with m=5 and n=3, the coupled ring oscillator of the five-stage, three-set type shown in FIG. 1, for example, is obtained.

Figure 8:
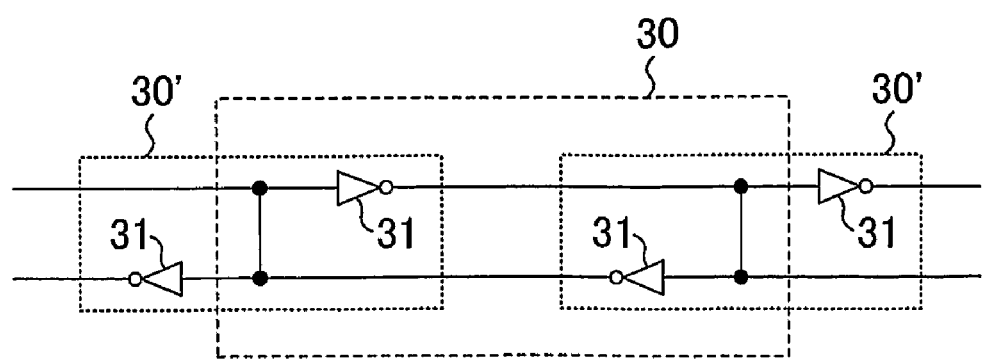
FIG. 8 shows relation between phase-coupling elements and a phase-coupling circuit when the phase-coupling elements are composed of inverter circuits.

FIG. 8 shows the relation between the phase-coupling elements 30' and the phase-coupling circuit 30 when the phase-coupling elements 30' are composed of inverter circuits. As shown in FIG. 8, when two phase-coupling elements 30' are connected to each other, a single phase-coupling circuit 30 is formed. More specifically, in the adjacent phase-coupling elements 30', the input terminal of one inverter circuit 31 in one of the two phase-coupling elements 30' is connected with the output terminal of one inverter circuit 31 in the other phase-coupling element 30'. Where the phase-coupling elements 30' are composed of NMOS transistors, the gate of one NMOS transistor 32 in one of the adjacent phase-coupling elements 30' is connected with the gate of one NMOS ransistor 32 in the other phase-coupling element 30'. In this manner, m×n phase-coupling elements 30' are connected to form a loop, whereby the phase-coupling loop 40 is obtained in which the m×n phase-coupling circuits 30 are connected into a loop.

Figure 9A:
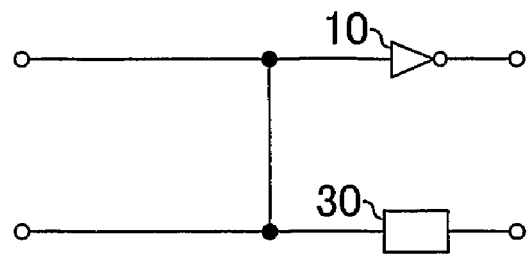
FIGS. 9A, 9B, 9C, and 9D show circuit configurations of basic cells in the coupled ring oscillator according to the second embodiment.
Figure 9B:
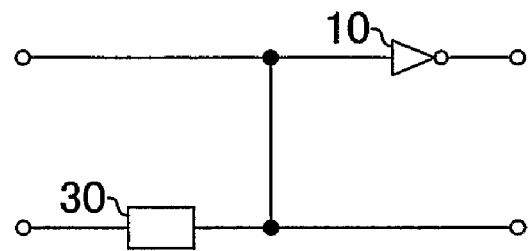
Figure 9C:
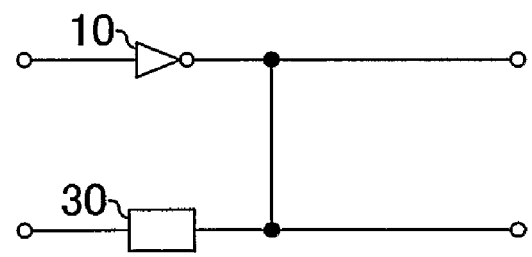
Figure 9D:
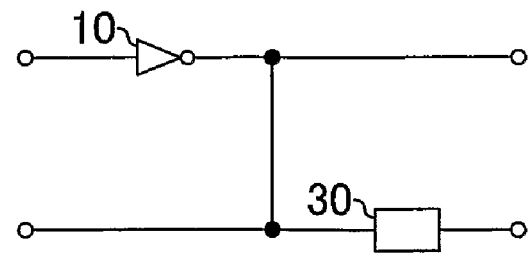

FIGS. 9A-9D show exemplary circuit configurations of the basic cells in the coupled ring oscillator according to the second embodiment. FIGS. 9A and 9B show exemplary configurations of the basic cells in which the input terminal of an inverter circuit 10 is connected with a phase-coupling circuit 30. FIGS. 9C and 9D show exemplary configurations of the basic cells in which the output terminal of an inverter circuit 10 is connected with a phase-coupling circuit 30.

The coupled ring oscillator of the second embodiment is formed in the following manner. First, m×n basic cells are laid out appropriately so as to form a loop. The phase-coupling circuits 30 in adjacent basic cells are connected with each other to form a single phase-coupling loop 40. Also, the input terminal of the inverter circuit 10 in one of any two basic cells existing (n−1) apart is connected with the output terminal of the inverter circuit 10 in the other basic cell, thereby forming m ring oscillators 20. If the layout is performed with m=5 and n=3, the coupled ring oscillator of the five-stage, three-set type shown in FIG. 3, for example, is obtained.

(Exemplary Configurations)

Exemplary configurations of coupled ring oscillators of a three-stage, three-set type formed according to the above layout methods will be shown.

Figure 10:
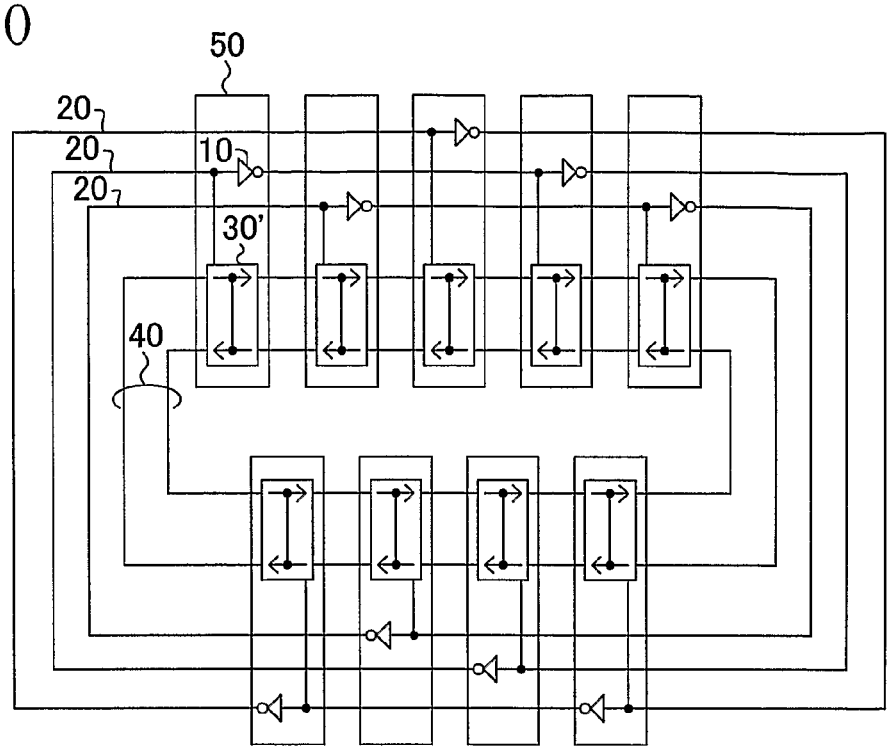
FIGS. 10, 11, 12, 13, 14, and 15 show exemplary configurations of a coupled ring oscillator of a three-stage, three-set type.
Figure 11:
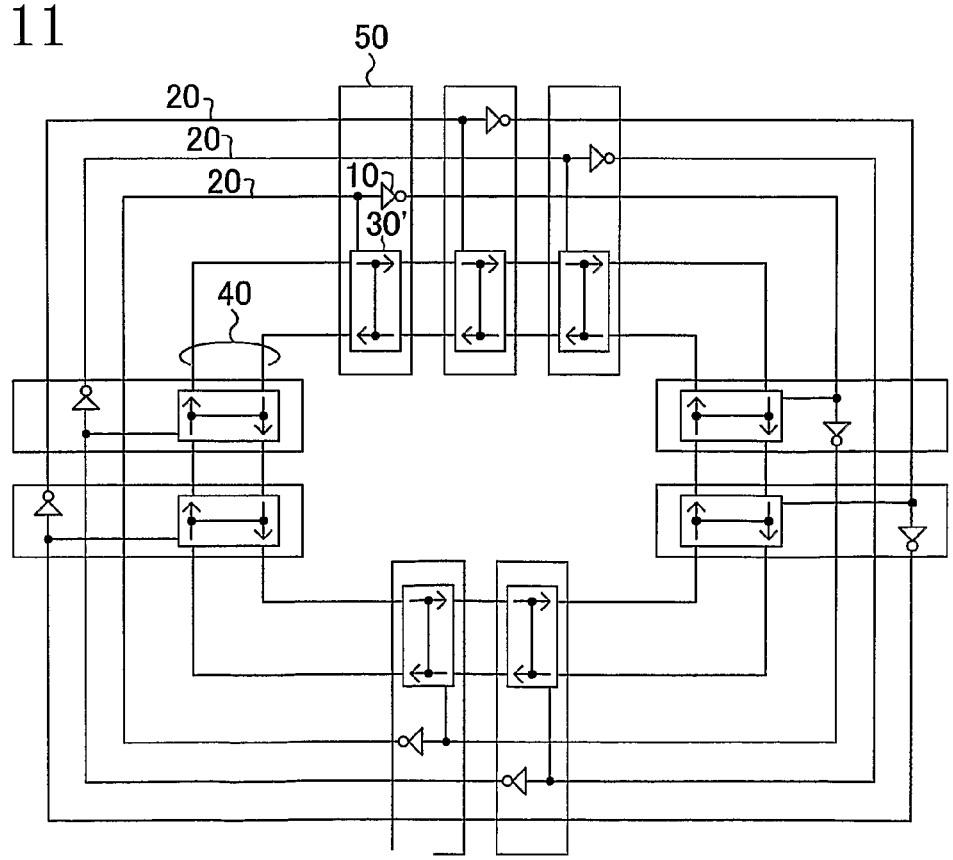
Figure 12:
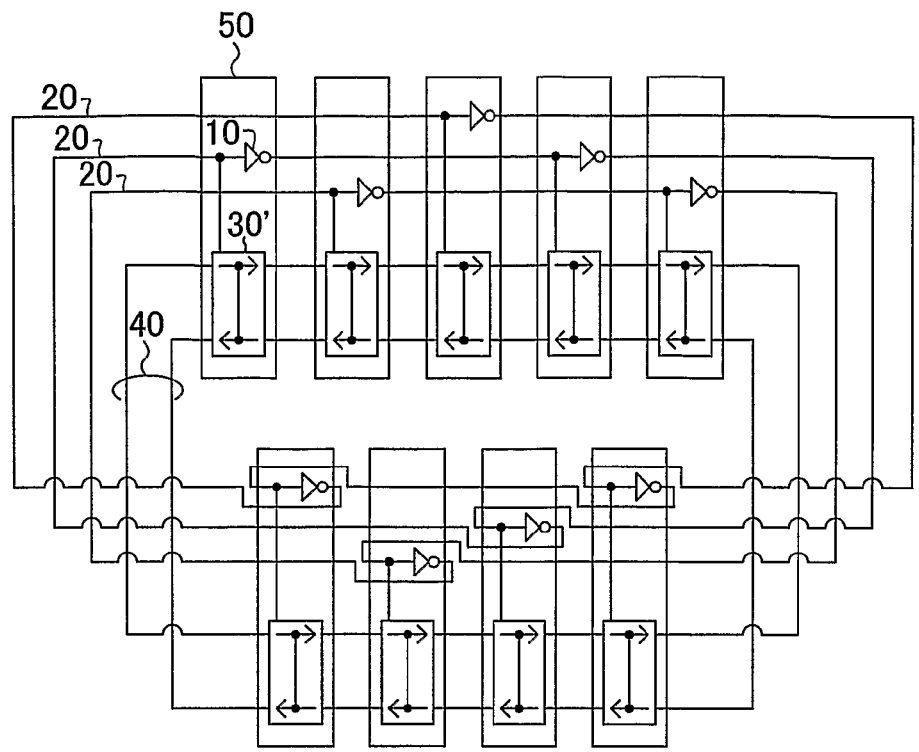

FIGS. 10, 11 and 12 show exemplary configurations of a coupled ring oscillator according to the first embodiment. In the exemplary configuration shown in FIG. 10, nine basic cells 50 are divided into four and five and the layout is performed so that the four basic cells 50 and the five basic cells 50 face each other. In the exemplary configuration shown in FIG. 11, the layout is performed so that the basic cells 50 are located on four sides. In the exemplary configuration shown in FIG. 12, nine basic cells 50 are divided into four and five and the layout is performed so that the four basic cells 50 and the five basic cells 50 face in the same direction. In each of the exemplary configurations, the basic cell shown in FIG. 5A or 6A is used.

Figure 13:
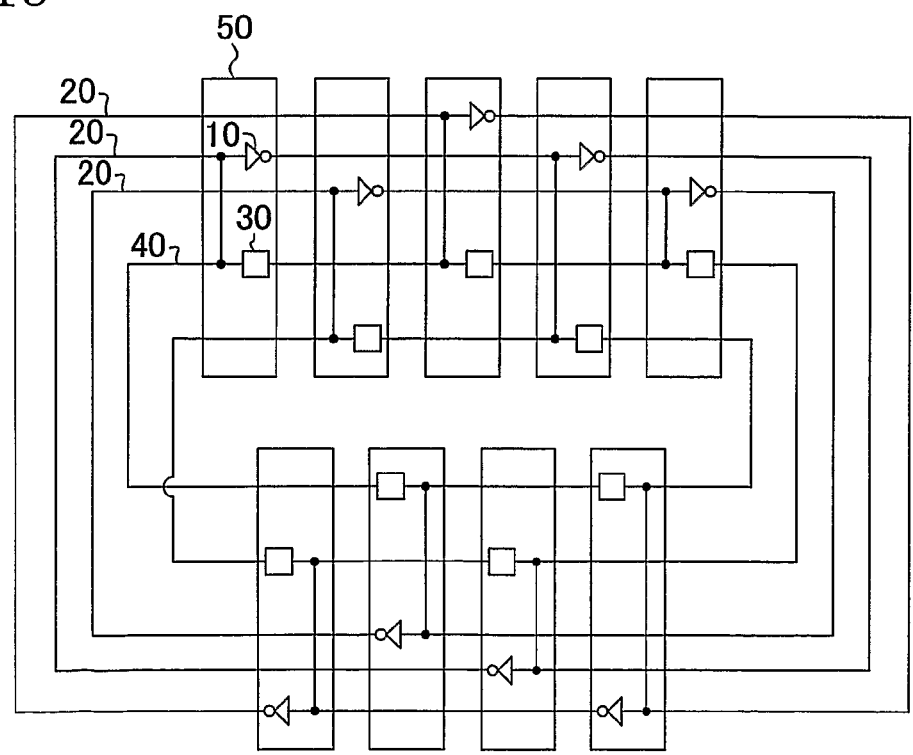
Figure 14:
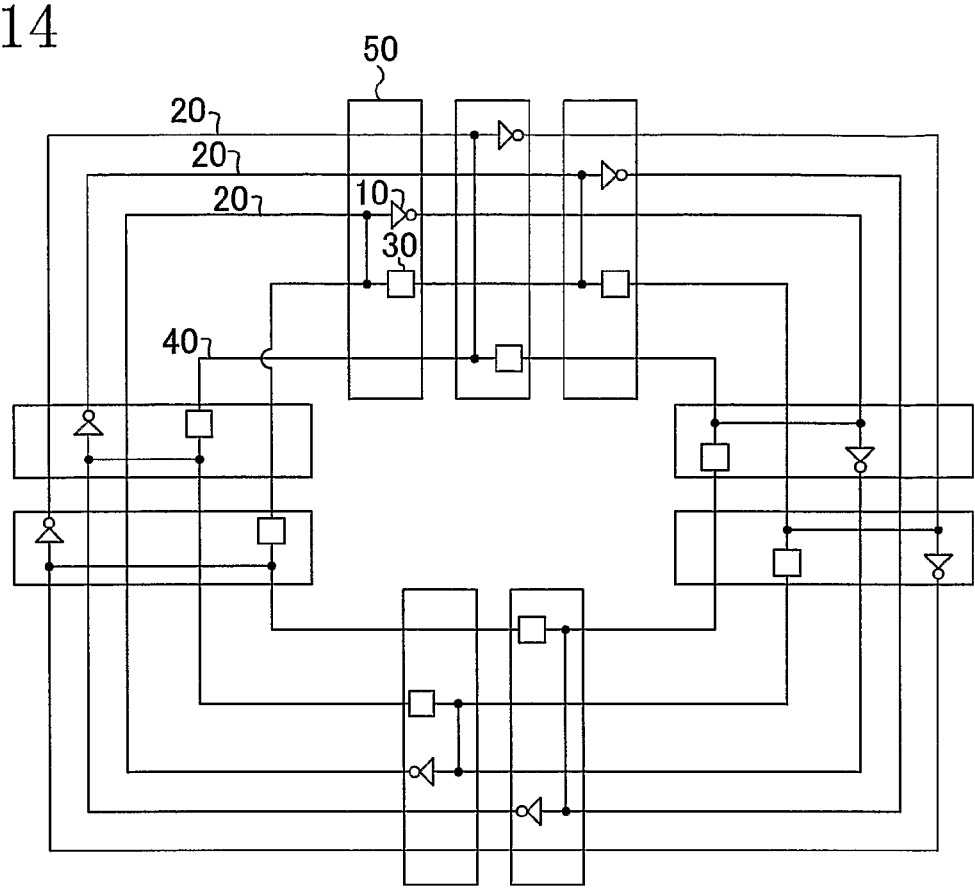
Figure 15:
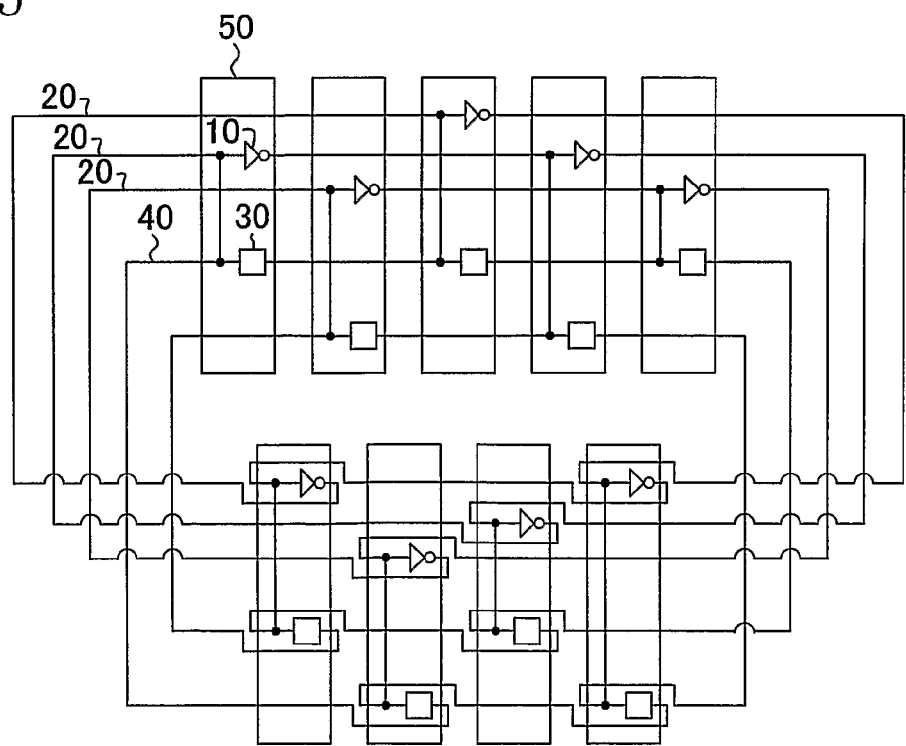

On the other hand, FIGS. 13, 14, and 15 show exemplary configurations of a coupled ring oscillator of the second embodiment. The configurations in FIGS. 13, 14, and 15 correspond to those shown in FIGS. 10, 11 and 12, respectively. In each of the exemplary configurations shown in FIGS. 13, 14, and 15, the basic cell shown in FIG. 9A is used.

As shown in FIGS. 12 and 15, in the coupled ring oscillators according to the preferred embodiments, the ring oscillators 20 and the phase-coupling loop 40 do not necessarily have to be arranged in a nested pattern. In cases where the ring oscillators 20 and the phase-coupling loop 40 are laid out in a nested pattern, the phase-coupling loop 40 is placed innermost. This is because the number of stages in which the phase-coupling circuits 30 are connected in the phase-coupling loop 40 is greater than the number of stages in which the inverter circuits 10 are connected in each ring oscillator 20, which causes more delays in the phase-coupling loop 40. However, the operation speed of the phase-coupling loop 40 must be higher than that of the ring oscillators 20. Therefore, in order to reduce the delays as much as possible, the phase-coupling loop 40 is preferably placed innermost in the nest so that the wire length thereof is shortened.

INDUSTRIAL APPLICABILITY

The inventive coupled ring oscillator generates highly accurate and fine phase information and is thus applicable, for example, to a high-resolution phase generating circuit such as a write strategy circuit for generating a write clock in an optical disk drive.

The invention claimed is:

1. A coupled ring oscillator comprising:
   n ring oscillators each including m inverter circuits and wires connecting the m inverter circuits arranged so that the m inverter circuits and the wires constitute n loop circuits each having a loop shape in a plan view; and
   a phase-coupling loop in which m×n phase-coupling circuits, each of which couples signal phases at two points in a certain phase mode, are connected with each other in a ring configuration in a plan view,
   wherein connection points at which the inverter circuits are connected with each other and the connection points at which the phase-coupling circuits are connected with each other are connected bijectively,
   each of the inverter circuits is connected between two points that divide the phase-coupling circuits into two parts at a certain ratio, and
   each of the n loop circuits of the ring oscillators does not include any of the m×n phase-coupling circuits, and encloses at least one common phase-coupling circuit in a plan view.

2. The coupled ring oscillator of claim 1, wherein the phase-coupling circuits each couple signal phases at two points in a reverse phase mode; and
   each of the inverter circuits is connected between two points that divide the phase-coupling circuits into n phase-coupling circuits and n×(m−1) phase-coupling circuits.

3. The coupled ring oscillator of claim 2, wherein the phase-coupling circuits each include two inverter circuits and an input terminal and an output terminal of one of the inverter circuits are connected with an output terminal and an input terminal of the other inverter circuit, respectively.

4. The coupled ring oscillator of claim 2, wherein the phase-coupling circuits each include two MOS transistors of the same polarity and a gate and a drain of one of the MOS transistors are connected with a drain and a gate of the other MOS transistor, respectively.

5. The coupled ring oscillator of claim 4, wherein the MOS transistors are NMOS transistors.

6. The coupled ring oscillator of claim 1, wherein, when the inner most ring oscillator is a first ring oscillator and the outermost ring oscillator is an m-th ring oscillator, a loop circuit of a k-th ring oscillator encloses a loop circuit of a (k−1)-th ring oscillator in a plan view where k=2 to m, and a loop circuit of the first ring oscillator encloses the m×n phase-coupling circuits in a plan view.

7. The coupled ring oscillator of claim 1, wherein each loop circuit of the n ring oscillators has a substantially rectangular shape in a plan view.

8. A method for laying out a coupled ring oscillator, comprising the steps of:
- (a) connecting m×n basic cells each including a phase-coupling element and a circuit element,
  wherein the phase-coupling element corresponds to two connected half-circuits, each equivalent to half of a phase-coupling circuit for coupling two signal phases at two points in a reverse phase mode, at both ends of the phase-coupling circuit,
  the circuit element includes an inverter circuit in which either an input terminal or an output terminal of the inverter circuit is connected to a connection point at which the two half-circuits are connected with each other, and
  the m×n basic cells are connected by wires so that inverter circuits and the wires constitute n loop circuits and each phase-coupling circuit is formed between adjacent ones of the phase-coupling elements, wherein each of the n loop circuits constituted by the inverter circuits and the wires encloses the phase-coupling elements in a plan view; and
- (b) connecting, in any two of the basic cells existing (n−1) apart, the input terminal of the inverter circuit in one of the two basic cells with the output terminal of the inverter circuit in the other basic cell.

9. The method of claim 8, wherein each of the phase-coupling elements includes two inverter circuits as the two half-circuits, and input terminals of the two inverter circuits are connected with each other; and
the method further includes the step (c) of connecting, in adjacent two of the phase-coupling elements, the input terminal of one of the inverter circuits in one of the two phase-coupling elements with an output terminal of one of the inverter circuits in the other phase-coupling element.

10. The method of claim 9, wherein the input terminals of the two inverter circuits in each phase-coupling element are connected with the input terminal of the inverter circuit in each of the basic cells.

11. The method of claim 8, wherein each of the phase-coupling elements includes two MOS transistors as the two half-circuits, and gates of the two MOS transistors are connected with each other; and
the method further includes the step (c) of connecting, in adjacent two of the phase-coupling elements, the gate of one of the MOS transistors in one of the two phase-coupling elements with a drain of one of the MOS transistors in the other phase-coupling element.

12. The method of claim 11, wherein the gates of the two MOS transistors in each phase-coupling element are connected with the input terminal of the inverter circuit in each of the basic cells.

13. The method of claim 11, wherein the MOS transistors are NMOS transistors.

14. A method for laying out a coupled ring oscillator, comprising the steps of:
- (a) connecting m×n basic cells each including a phase-coupling circuit for coupling two signal phases at two points in a certain phase mode and a circuit element,
  wherein the circuit element includes an inverter circuit in which either an input terminal or an output terminal of the inverter circuit is connected to one end of the phase-coupling circuit, and
  the m×n basic cells are connected by wires so that inverter circuits and the wires constitute n loop circuits and the phase-coupling circuits are connected with each other, wherein each of the n loop circuits constituted by the inverter circuits and the wires encloses the phase-coupling elements in a plan view; and
- (b) connecting, in any two of the basic cells existing (n−1) apart, the input terminal of the inverter circuit in one of the two basic cells with the output terminal of the inverter circuit in the other basic cell.

15. The method of claim 14, wherein each of the phase-coupling circuits couples signal phases at two points in a reverse phase mode; and
in the step (a), the basic cells are connected so that adjacent ones of the phase-coupling circuits are connected with each other.

16. The coupled ring oscillator of claim 1, wherein each of the loop circuit of the ring oscillators encloses all of the m×n phase-coupling circuits in a plan view.

17. The method of claim 8, wherein the loop circuits constituted by the inverter circuits and the wires do not include any of the phase-coupling elements, and each of the n loop circuits constituted by the inverter circuits and the wires encloses at least one common phase-coupling element in a plan view.

18. The method of claim 17, wherein each of the n loop circuits encloses all of the phase-coupling circuits in a plan view.

19. The method of claim 14, wherein the loop circuits constituted by the inverter circuits and the wires do not include any of the phase-coupling elements, and each the n loop circuits constituted by the inverter circuits and the wires encloses at least one common phase-coupling element in a plan view.

20. The method of claim 19, wherein each of the n loop circuits encloses all of the phase-coupling circuits in a plan view.

* * * * *